US010784305B2

(12) United States Patent
Huang et al.

(10) Patent No.: US 10,784,305 B2
(45) Date of Patent: Sep. 22, 2020

(54) X-RAY DETECTOR SUBSTRATE BASED ON PHOTODIODES WITH A RADIAL PIN JUNCTION STRUCTURE

(71) Applicant: BOE TECHNOLOGY GROUP CO., LTD., Beijing (CN)

(72) Inventors: Rui Huang, Beijing (CN); Jianming Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 369 days.

(21) Appl. No.: 15/768,229

(22) PCT Filed: Sep. 28, 2017

(86) PCT No.: PCT/CN2017/103914
§ 371 (c)(1),
(2) Date: Apr. 13, 2018

(87) PCT Pub. No.: WO2018/192185
PCT Pub. Date: Oct. 25, 2018

(65) Prior Publication Data
US 2020/0258935 A1 Aug. 13, 2020

(30) Foreign Application Priority Data
Apr. 18, 2017 (CN) .......................... 2017 1 0253989

(51) Int. Cl.
H01L 27/146 (2006.01)
G01T 1/20 (2006.01)
(Continued)

(52) U.S. Cl.
CPC ...... H01L 27/14659 (2013.01); G01T 1/2018 (2013.01); H01L 27/1461 (2013.01);
(Continued)

(58) Field of Classification Search
CPC ............... G01T 1/2018; H01L 27/1461; H01L 27/14616; H01L 27/14659;
(Continued)

(56) References Cited

U.S. PATENT DOCUMENTS

2012/0161018 A1 6/2012 Shin
2014/0027828 A1 1/2014 Kim
(Continued)

FOREIGN PATENT DOCUMENTS

CN 102856441 A 1/2013
CN 204558467 U 8/2015
(Continued)

OTHER PUBLICATIONS

International Search Report & Written Opinion dated Jan. 29, 2018, regarding PCT/CN2017/103914.
(Continued)

Primary Examiner — Mark R Gaworecki
(74) Attorney, Agent, or Firm — Intellectual Valley Law, P.C.

(57) ABSTRACT

The present application discloses a photodiode structure including multiple light trapping elements. Each light trapping element includes an N-type silicon layer with a recessed structure therein, an intrinsic silicon layer disposed overlying the N-type silicon layer including a side region and a bottom region inside the recessed structure, and a P-type silicon layer disposed as an inner layer overlying the intrinsic silicon layer inside the recessed structure. A radial PIN junction is formed around a nominal axis of the recessed structure.

20 Claims, 4 Drawing Sheets

(51) Int. Cl.
*H01L 29/66* (2006.01)
*H01L 29/786* (2006.01)

(52) U.S. Cl.
CPC .. *H01L 27/14616* (2013.01); *H01L 27/14689* (2013.01); *H01L 27/14692* (2013.01); *H01L 29/66765* (2013.01); *H01L 29/78669* (2013.01)

(58) Field of Classification Search
CPC ......... H01L 27/14689; H01L 27/14692; H01L 29/66765; H01L 29/78669
See application file for complete search history.

(56) References Cited

U.S. PATENT DOCUMENTS

| | | | |
|---|---|---|---|
| 2014/0209155 A1 | | 7/2014 | Schroeder et al. |
| 2015/0075599 A1 | | 3/2015 | Yu et al. |

FOREIGN PATENT DOCUMENTS

| | | | |
|---|---|---|---|
| CN | 104900746 | A | 9/2015 |
| CN | 105144406 | A | 12/2015 |
| CN | 105814695 | A | 7/2016 |
| EP | 2919269 | A2 | 9/2015 |
| JP | 2003309256 | A | 10/2003 |

OTHER PUBLICATIONS

First Office Action in the Chinese Patent Application No. 201710253989.0, dated Jun. 3, 2019; English translation attached.

X-RAY DETECTOR SUBSTRATE BASED ON PHOTODIODES WITH A RADIAL PIN JUNCTION STRUCTURE

CROSS-REFERENCE TO RELATED APPLICATION

This application is a national stage application under 35 U.S.C. § 371 of International Application No. PCT/CN2017/103914, filed Sep. 28, 2017, which claims priority to Chinese Patent Application No. 201710253989.0, filed Apr. 18, 2017, the contents of which are incorporated by reference in the entirely.

TECHNICAL FIELD

The present invention relates to display technology, more particularly, to a photodiode structure, an X-ray detector substrate for X-ray imaging.

BACKGROUND

X-ray detection technology has been widely used in various fields like industrial non-destructive inspection, cargo scanning, circuit board testing, medical diagnostic application, and security application. Traditional X-ray imaging technology based on analog signals yields images with low resolution and poor picture quality. Since 1990s, X-ray imaging based on digital radiography (DR) has been developed using an X-ray detector substrate that is able to convert an X-ray image directly to a digital image. The digital X-ray image has a clearer picture with a high resolution and is easier to save and transfer.

Based on its different image conversion structure, the X-ray detector substrate can be categorized to two types of either a direct DR or an indirect DR. The indirect DR type X-ray detector substrate has a scintillator structure that firstly converts X-ray light into visible light, a photodiode structure secondly for generating electrical signals based on detection of the converted visible light. Based on the electrical signals, digital images are generated. The indirect DR type X-ray detector substrate has some advantages over the direct DR type because of relative lower costs due to more matured manufacture techniques, higher detective quantum efficiency (DQE), and better product reliability. Yet, improving light conversion efficiency of the photodiode structure is desired.

SUMMARY

In an aspect, the present disclosure provides a photodiode structure including multiple light trapping elements. Each light trapping element includes an N-type silicon layer with a recessed structure therein, an intrinsic silicon layer overlying the N-type silicon layer including a side region and a bottom region inside the recessed structure, and a P-type silicon layer as an inner layer overlying the intrinsic silicon layer inside the recessed structure. The N-type silicon layer, the intrinsic silicon layer, and the P-type silicon layer form a radial PIN junction around a nominal axis of the recessed structure.

Optionally, the multiple light trapping elements are arranged periodically.

Optionally, each recessed structure is a cylindrical shape with a hollow cylinder structure around the nominal axis surrounded by the P-type silicon layer.

Optionally, the N-type silicon layer includes a thickness in a proximate range from 800 nm to 1200 nm and a depth of each recessed structure in a proximate range from 700 nm to 1100 nm, each recessed structure has a diameter of proximately 1200 nm to 1800 nm, and two adjacent recessed structures has a distance of proximately 1300 nm to 2000 nm.

Optionally, the intrinsic silicon layer includes a thickness of proximately 200 nm to 300 nm.

Optionally, the P-type silicon layer includes a thickness of proximately 15 nm to 40 nm.

Optionally, the N-type silicon layer of each of the multiple light trapping elements is one physical layer with multiple recessed structures patterned therein substantially perpendicular to a base substrate.

In another aspect, the present disclosure provides an X-ray detector panel including a substrate, a photodiode structure described herein disposed on the substrate, multiple thin-film transistors disposed between the photodiode structure and the substrate, and multiple electric current extracting devices disposed on the photodiode structure. Each of the multiple thin-film transistor includes a drain terminal coupled to the N-type silicon layer of a corresponding one of the multiple light trapping elements and each of the multiple electric current extracting device is coupled to the P-type silicon layer of the corresponding one of the multiple light trapping elements.

Optionally, each of the multiple electric current extracting devices includes a first transparent electrode layer disposed on the photodiode structure, a passivation layer overlying the first transparent electrode layer, a second transparent electrode layer overlying the passivation layer and connecting to the first transparent electrode layer by filling a through-hole penetrating the passivation layer, a conductor metal layer overlying the second transparent electrode layer, and a protection layer overlying the conductor metal layer.

Optionally, the through-hole penetrating the passivation layer is formed at a region between two adjacent radial PIN junctions.

In another aspect, the present disclosure provides a photodiode structure. The photodiode structure includes multiple light trapping elements. Each light trapping element includes an N-type silicon layer with protruded structure thereon, an intrinsic silicon layer disposed overlying the N-type silicon layer including a side region and a top region of the protruded structure, and a P-type silicon layer disposed as an outer layer overlying the intrinsic silicon layer around the protruded structure. The N-type silicon layer, the intrinsic silicon layer, and the P-type silicon layer form a radial PIN junction around a nominal axis of the protruded structure substantially perpendicular to a base substrate.

Optionally, each protruded structure is a cylindrical shape around the nominal axis surrounded firstly by the intrinsic silicon layer and secondly by the P-type silicon layer.

Optionally, the N-type silicon layer of each of the multiple light trapping elements is one physical layer having a thickness of proximately 15 nm to 40 nm and multiple protruded structure formed thereon. The protruded structure has a height in a proximate range from 800 nm to 1100 nm and a diameter in a proximate range of from 25 nm to 50 nm. Two adjacent protruded structures have a separation of proximately 1300 nm to 2000 nm. The intrinsic silicon layer comprises a thickness of proximately 200 nm to 300 nm, and the P-type silicon layer comprises a thickness of proximately 15 nm to 40 nm.

In another aspect, the present disclosure provides an X-ray detector substrate. The X-ray detector substrate includes a substrate, a photodiode structure described herein disposed on the substrate, multiple thin-film transistors disposed between the photodiode structure and the substrate, and multiple electric current extracting devices disposed on the photodiode structure. Each of the multiple thin-film transistor includes a drain or source terminal coupled to the N-type silicon layer of a corresponding one of the multiple light trapping elements and each of the multiple electric current extracting device is coupled to the P-type silicon layer of the corresponding one of the multiple light trapping elements.

Optionally, each of the multiple electric current extracting devices includes a first transparent electrode layer disposed on the photodiode structure, a passivation layer overlying the first transparent electrode layer, a second transparent electrode layer overlying the passivation layer and connecting to the first transparent electrode layer by filling a through-hole penetrating the passivation layer, a conductor metal layer overlying the second transparent electrode layer, and a protection layer overlying the conductor metal layer.

Optionally, the through-hole penetrating the passivation layer is formed on top of each radial PIN junction.

In another aspect, the present disclosure provides a method of fabricating a photodiode structure described herein. The method includes forming an N-type silicon layer on a substrate; forming multiple recessed structures in the N-type silicon layer; forming an intrinsic silicon layer overlying the N-type silicon layer including a side region and a bottom region inside each of the multiple recessed structures; and forming a P-type silicon layer as an inner layer overlying the intrinsic silicon layer inside each of the multiple recessed structures. A radial PIN junction is formed around a nominal axis of each of the multiple recessed structures.

In another aspect, the present disclosure provides a method of fabricating a photodiode structure described herein. The method includes forming an N-type silicon layer on a substrate; forming multiple protruded structures in N-type silicon material on the N-type silicon layer; forming an intrinsic silicon layer overlying the N-type material including a side region and a top region of each of the multiple protruded structures; and forming a P-type silicon layer as an outer layer overlying the intrinsic silicon layer. A radial PIN junction is formed around a nominal axis of each of the multiple protruded structures.

In another aspect, the present disclosure provides a method of fabricating an X-ray detector substrate described herein. The method includes forming multiple thin-film transistors on a substrate; forming a photodiode structure on the substrate including multiple light trapping elements using the method described herein. Each of the multiple light trapping elements includes a recessed radial PIN junction having an N-type silicon layer coupled to a drain terminal layer of a respective one of the multiple thin-film transistors. Additionally, the method includes forming multiple electric current extracting devices on the photodiode structure. The multiple electric current extracting devices are respectively coupled to the multiple light trapping elements of the photodiode structure.

In yet another aspect, the present disclosure provides a method of fabricating an X-ray detector substrate described herein. The method includes forming multiple thin-film transistors on a substrate and forming a photodiode structure on the substrate including multiple light trapping elements using the method described herein. Each of the multiple light trapping elements includes a protruded radial PIN junction having an N-type silicon layer coupled to a drain terminal layer of a respective one of the multiple thin-film transistors. The method further includes forming multiple electric current extracting devices on the photodiode structure. The multiple electric current extracting devices are respectively coupled to the multiple light trapping elements of the photodiode structure.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The indirect DR type X-ray detector substrate includes at least thin-film transistors and photodiodes. Under illumination of X-ray, a scintillator layer or a Phosphor layer in the detector substrate converts X-ray photons into visible light photons. Then, the photodiodes are able to convert the visible light photons into electrical signals. The thin-film transistors are employed to read the electrical signals and output the electrical signals to generate a display image. The photodiodes are key elements of the indirect DR type X-ray detector substrate. The photo-electric conversion efficiency of the photodiodes plays an important role in determining several key quality indicators of the X-ray detector substrate, such as X-ray dose, resolution of X-ray imaging, and image response speed.

Accordingly, the present disclosure provides, inter alia, a photodiode structure, an X-ray detector substrate having the same photodiode structure, and a fabricating method thereof that substantially obviate one or more of the problems due to limitations and disadvantages of the related art.

Figure 1:
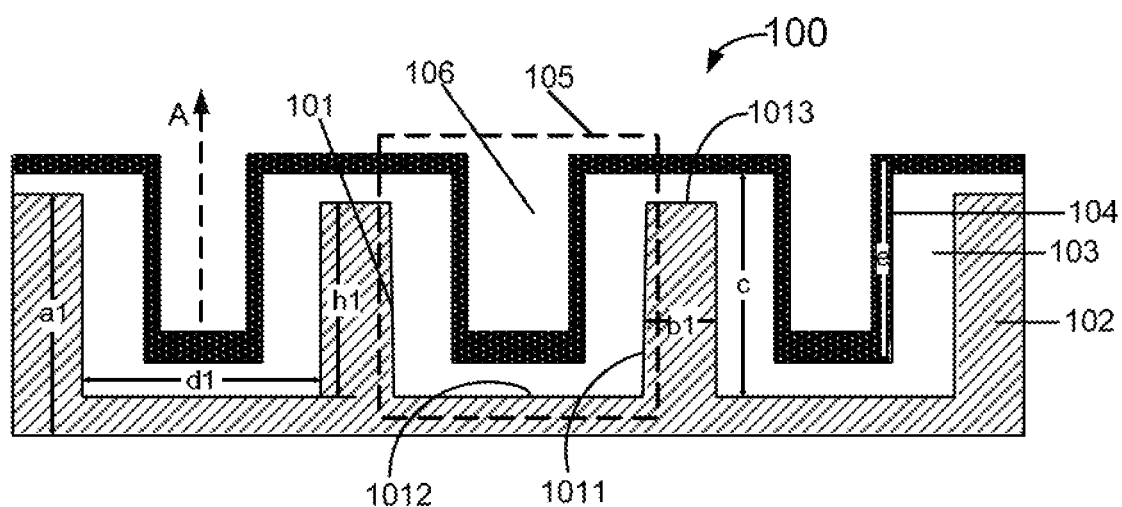
FIG. 1 is a cross-section view of a photodiode structure with a recessed radial PIN junction structure according to an embodiment of the present disclosure.
Figure 2:
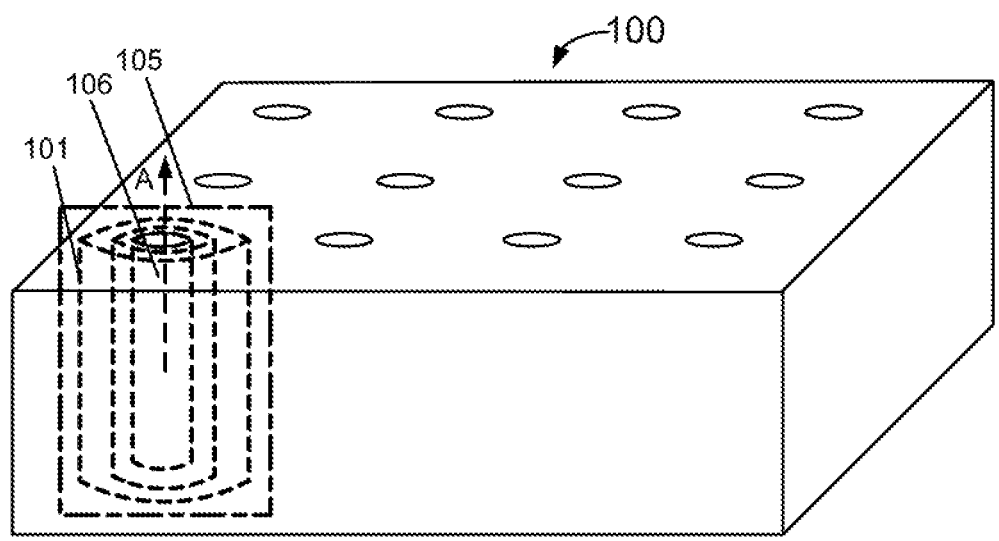
FIG. 2 is a perspective view of the photodiode structure with a recessed radial PIN junction structure of FIG. 1 according to the embodiment of the present disclosure.

In one aspect, the present disclosure provides an improved photodiode structure used in X-ray detector substrate for generating X-ray image. FIG. 1 is a cross-section view of a photodiode structure with a recessed radial PIN junction structure according to an embodiment of the present disclosure. Referring to FIG. 1, the photodiode structure 100 includes multiple light trapping elements. Each light trapping element includes an N-type silicon layer 102 with a recessed structure 101 therein, an intrinsic silicon layer 103 disposed overlying the N-type silicon layer 102 including a side region 1011 and a bottom region 1012 inside the recessed structure 101, and a P-type silicon layer 104 disposed as an inner layer overlying the intrinsic silicon layer 103 inside the recessed structure 101. FIG. 2 shows a perspective view of the same photodiode structure 100 described herein. As seen, each light trapping element is formed around a hollow space or cavity associated with the corresponding recessed structure 101 as a radial shaped PIN junction 105, providing a physical structure that facilitates trapping of visible light photons in terms of reflection and absorption and enhances photoelectric conversion efficiency of the photodiode structure 100.

Optionally, the multiple recessed structures 101 can be arranged with a periodic distribution or other patterns. Referring to FIG. 2, the N-type silicon layer 102 up to a certain thickness a1 is firstly formed and a portion of the silicon material at a corresponding location of the N-type silicon layer 102 is etched to form each recessed structure 101 with a certain depth h1 (h1<a1) and a diameter d1. Each recessed structure 101 on average is formed at a distance of b1 away from an adjacent recessed structure. Optionally, each of the multiple recessed structures 101 is formed with a nominal axis A substantially perpendicular to a base substrate. In some embodiments, the base substrate is a surface of a functional layer for collecting electrical current converted by the photodiode structure 100 to generate voltage signals used for produce digital images. For example, the functional layer includes a plurality of thin-film transistors using their drain or source terminals to receive corresponding electrical current from the N-type silicon layer 102 of the radial PIN junctions 105 around the nominal axis A of the recessed structures 101 associated with the multiple light trapping elements of the photodiode structure 100.

Optionally, the intrinsic silicon layer 103 is formed with a thickness c of intrinsic silicon material over the N-type silicon layer 102 including a top surface region 1013, and side and bottom regions inside the recessed structure 101. Optionally, after forming the intrinsic silicon layer, an annular hole associated with the recessed structure 101 is retained with certain thickness of the intrinsic silicon material covering the N-type silicon material in the side region 1011 and the bottom region 1012 inside the recessed structures.

Optionally, the P-type silicon layer 104 is formed with a thickness e of P-type silicon material overlying the intrinsic silicon layer 103 in a substantially similar manner with the annular hole associated with the recessed structure substantially retained. A certain thickness of the P-type silicon layer is added onto the intrinsic silicon layer at both the side region and bottom region inside the recessed structures.

In some embodiments, all the N-type silicon layer 102, the intrinsic silicon layer 103, and the P-type silicon layer 103 formed around the recessed structure 101 form a radial PIN junction 105. Referring to the FIG. 1 and FIG. 2, the recessed structure 101 is a hollow cylinder shape and the redial PIN junction 105 is a hollow (multi-layer) ring shape around a nominal axis A. There is no specific limitation on a cross-sectional shape of the recessed structure. It can be a circle or a polygon or other irregular shapes. Accordingly, there is no specific limitation on a cross-sectional shape of the radial PIN junction. It can be a circular ring, or any other shape with an irregular annular hole structure.

In some embodiments, the photoelectric conversion efficiency of the photodiode structure 100 is depended on the thicknesses of the corresponding silicon layers associated with the radial PIN junction, the diameter and the depth of the recessed structure. Optionally, the N-type silicon layer 102 is provided with a thickness a1 in a range of 800 nm-1200 nm and the recessed structure 101 formed therein is provided with a depth h1 in a range of 700 nm-1100 nm and a diameter d1 in a range of 1200 nm-1800 nm. Evert two adjacent recessed structures are set with a distance in a range of 1300 nm-2000 nm. Optionally, the intrinsic silicon layer 103 is provided with a thickness c in a range of 200 nm-300 nm. Optionally, the P-type silicon layer 104 is provided with a thickness e in a range of 15 nm and 40 nm. Particularly inside the recessed structure 101, the thicknesses of the intrinsic silicon layer 103 and the P-type silicon layer 104 at the side region 1011 and the bottom region 1012 may be even less than the above thickness values mentioned above. In an example, the depth h1 of the recessed structure 101 of the N-type silicon layer 102 is selected to be proximately 980 nm and the thickness a1 of the N-type silicon layer 102 without the recessed structure is selected to be proximately 1000 nm. Each recessed structure 101 has a diameter d1 selected to be 1400 nm and every two adjacent recessed structures has a distance b1 selected to be 1500 nm. The intrinsic silicon layer 103 is selected with a thickness c of proximately 250 nm. The P-type silicon layer 104 is selected with a thickness e of proximately 20 nm.

Figure 3:
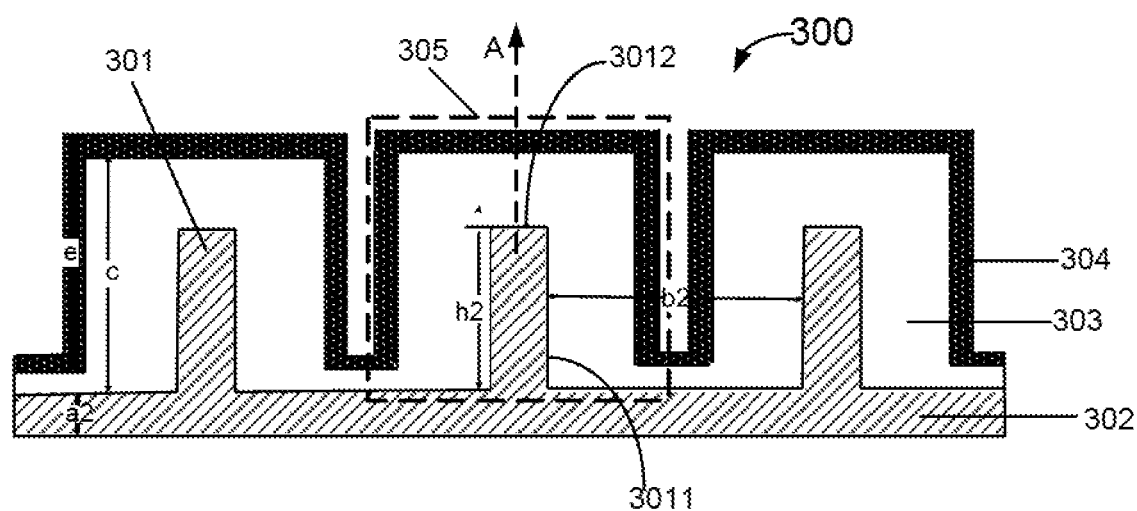
FIG. 3 is a cross-section view of a photodiode with a protruded radial PIN junction structure according to another embodiment of the present disclosure.
Figure 4:
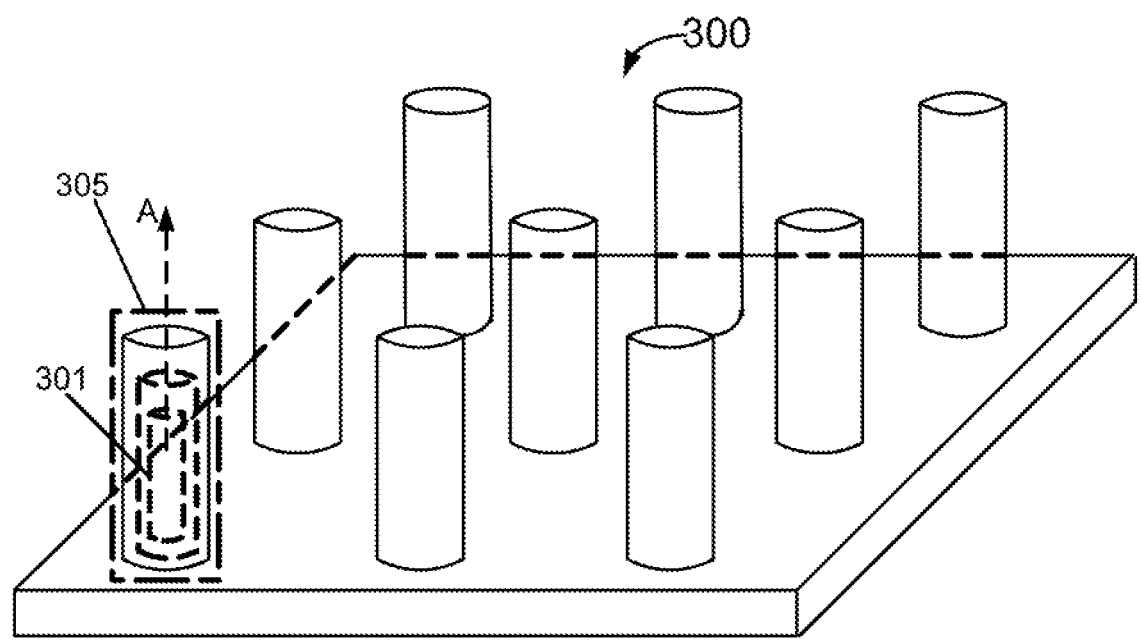
FIG. 4 is a perspective view of the photodiode structure with a protruded radial PIN junction structure of FIG. 3 according to the embodiment of the present disclosure.

In some embodiments, the photodiode structure for X-ray detector substrate can be provided with multiple light trapping elements in protruded structures. FIG. 3 is a cross-section view of a photodiode with a protruded radial PIN junction structure according to another embodiment of the present disclosure. Referring to FIG. 3, the photodiode structure 300 includes multiple light trapping elements. Each light trapping element includes an N-type silicon layer 302 with a protruded structure 301. Optionally, the protruded structure 301 is a column-like structure with a nominal axis A. Further the light trapping element includes an intrinsic silicon layer 303 overlying the N-type silicon layer 302 including a side region 3011 and a top region 3012 of the protruded structure 301. Moreover, the light-trapping element includes a P-type silicon layer 304 disposed as an outer layer overlying the intrinsic silicon layer 303 around the protruded structure 301. FIG. 4 shows a perspective view of the same photodiode structure 300 described herein. As seen, each light trapping element is formed around a solid protruded structure 301 as a radial shaped PIN junction 305, providing a physical structure that facilitates trapping of visible light photons in terms of reflection and absorption and enhances photoelectric conversion efficiency of the photodiode structure 300.

Optionally, the protruded structure 301 and the corresponding radial shaped PIN junction 305 can be in a regular cylinder shape around the nominal axis A. Optionally, the protruded structure can have other column-like structure with regular or irregular cross-sectional shape. Preferably the nominal axis A is substantially perpendicular to a flat portion of the N-type silicon layer 302 formed on a base substrate. In some embodiments, the base substrate is a surface of a functional layer for collecting electrical current converted by the photodiode structure 300 to generate voltage signals used for produce digital images. For example, the functional layer includes a plurality of thin-film transistors using their drain or source terminals to receive corresponding electrical current from the N-type silicon layer 302 of the radial PIN junctions 305 around the protruded structures 301 associated with the multiple light trapping elements of the photodiode structure 300.

In some embodiments, the photoelectric conversion efficiency of the photodiode structure 300 is depended on the thicknesses of the corresponding silicon layers associated with the radial PIN junction, the diameter and the depth of the recessed structure. Optionally, the N-type silicon layer 302 is provided with a thickness a2 in a range of 15 nm-40 nm and the protruded structure 301 is formed above with a height h2 in a range of 800 nm-1100 nm and a diameter d2 in a range of 25 nm-50 nm. Evert two adjacent protruded structures are set with a distance in a range of 1300 nm-2000 nm. Optionally, the intrinsic silicon layer 303 is provided with a thickness c in a range of 200 nm-300 nm. Optionally, the P-type silicon layer 304 is provided with a thickness e in a range of 15 nm and 40 nm. In an example, the depth h2 of the protruded structure 301 of the N-type silicon layer 302 is selected to be proximately 1000 nm and the thickness a2 of the N-type silicon layer 102 without the protruded structure is selected to be proximately 20 nm. Each protruded structure 301 has a diameter d2 selected to be 40 nm and every two adjacent protruded structures has a distance b2 selected to be 1500 nm. The intrinsic silicon layer 303 is selected with a thickness c of proximately 250 nm. The P-type silicon layer 304 is selected with a thickness e of proximately 20 nm.

Figure 5:
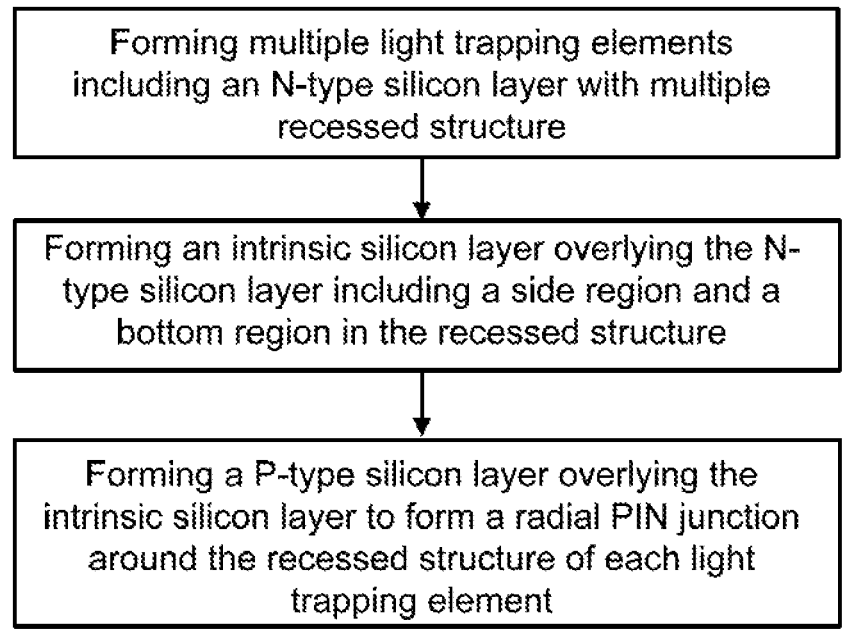
FIG. 5 is flow chart showing a method of fabricating the photodiodes with a recessed radial PIN junction structure according to some embodiments of the present disclosure.

In another aspect, the present disclosure provides a method for fabricating the photodiode structure as shown in FIG. 1 and FIG. 2. FIG. 5 is a flow chart showing a method of fabricating the photodiodes with a recessed radial PIN junction structure according to some embodiments of the present disclosure. In particular, the method includes forming multiple light trapping elements including an N-type silicon layer with multiple recessed structure. The N-type silicon layer is deposited up to a certain thickness a1 of about 800-1200 nm on a surface of a base substrate. The deposition can be performed using Chemical Vapor Deposition (CVD) or Physical Vapor Deposition (PVD) method with proper N-type impurity being added as one of deposited precursors for achieving a desired N-type semiconducting doping level. The base substrate optionally can be a functional layer formed in a previous process for making an X-ray detector substrate. The multiple light trapping elements include multiple recessed structures like annular holes formed into the N-type silicon layer. Optionally, a series of processes can be employed for forming the recessed structure, including photoresist coating, masking, exposing certain frequency of light, developing process, etching, and photoresist removing, etc. Each of the multiple recessed structures can be formed with a depth h1 of about 700-1100 nm, a diameter d1 of about 1200-1800 nm, and a distance b1 of about 1300-2000 nm from any adjacent recessed structure. The recessed structure formed in the N-type silicon layer will serve as a base structure for forming a recessed radial PIN junction. Through the above processes, optionally, the multiple recessed structures formed in the N-type silicon layer have a periodic arrangement or pattern. Optionally, each recessed structure has a regular cross-section shape. Optionally, each recessed structure is formed with a nominal axis A perpendicular to the surface of the base substrate to make the light trapping elements substantially perpendicular to carrier transporting direction along the base substrate.

Further shown in FIG. 5, the method includes forming an intrinsic silicon layer overlying the N-type silicon layer including a side region and a bottom region in the recessed structure. Plasma Enhanced CVD (PECVD) is employed to deposit the intrinsic silicon layer overlying the N-type silicon layer having the multiple recessed structures. This method allows the intrinsic silicon layer can be properly formed with a certain thickness being added conformingly to the side region and bottom region of each recessed structure while retaining an annular hole at the recessed structure. In an example, a thickness of about 200 nm-300 nm intrinsic silicon layer can be deposited.

Additionally, the method includes forming a P-type silicon layer overlying the intrinsic silicon layer to form a radial PIN junction around the recessed structure of each light trapping element. Similarly, PECVD method is employed to deposit the P-type silicon layer (with desired P-type semi-conducting doping level) overlying the earlier-formed intrinsic silicon layer. A certain thickness of the P-type silicon layer can be added conformingly to the side region and bottom region in the retained recessed structure. Optionally, a thickness of about 15-40 nm of P-type silicon layer can be deposited.

Alternatively, a method of fabricating a photodiode structure having multiple light trapping elements in protruded radial PIN junctions is also provided according to some embodiments of the present disclosure. The method includes some processes that are similar to those described above with detailed descriptions omitted here.

Figure 6:
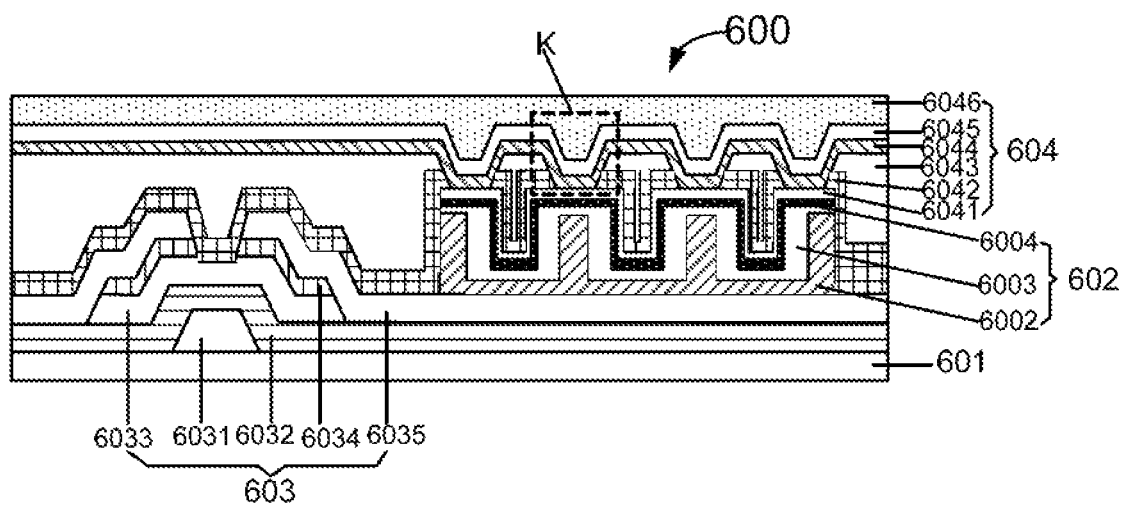
FIG. 6 is a cross-section view of an X-ray detector substrate based on the photodiode structure of FIG. 1 according to an embodiment of the present disclosure.

In another aspect, the present disclosure also provides an X-ray detector substrate including the photodiode structure described herein. FIG. 6 is a cross-section view of an X-ray detector substrate based on the photodiode structure of FIG. 1 according to an embodiment of the present disclosure. Referring to FIG. 6, the X-ray detector substrate 600 at least includes a substrate 601, multiple photodiodes 602, multiple thin-film transistors between the substrate 601 and the photodiodes 602, and multiple electric current extracting devices 604 formed on top of the photodiodes 602. In the embodiment, the multiple photodiodes 602 are provided in the photodiode structure described in FIG. 1.

In some embodiments, the multiple thin-film transistors 603 correspond respectively to the multiple photodiodes 602 which are provided with multiple light trapping elements in a same photodiode structure 100 shown in FIG. 1. In particular, each of the multiple light trapping elements includes a radial PIN junction (105) with its N-type silicon layer (102) being coupled to a drain or source terminal 6035 of one of the multiple thin-film transistors 603. The multiple electric current extracting devices 604 also correspond respectively to the multiple photodiodes 602 by coupling to corresponding P-type silicon layer (104) of the PIN junctions (105). Herein, the multiple photodiodes 602 is also referred as a photodiode structure 602. The electric current extracting device 604 is configured to extract carrier current out of all PIN junctions while the thin-film transistor 603 is configured to deduce an electric voltage signal based on current out of each PIN junction so that a corresponding image signal related to particular location can be generated.

Optionally, the thin-film transistor 603 in the X-ray detector substrate 600 can be provided as a top-gate thin-film transistor. Optionally, the thin-film transistor 603 is provided as a bottom-gate thin-film transistor. Referring to FIG. 6, the thin-film transistor 603 (a bottom-gate type) includes a gate metal layer 6031, a gate insulator layer 6032, an amorphous silicon layer 6033, a doped amorphous silicon layer 6034, and a source or drain metal layer 6035.

Optionally, the electric current extracting device 604 in the X-ray detector substrate 600 is formed over the photodiode structure 602 and the thin-film transistor 603 in a configuration being parallel to the substrate 601 and perpendicular to the light trapping elements of the photodiodes 602. Referring to FIG. 6, the electric current extracting device 604 includes a first transparent electrode layer 6041 coupled to the P-type silicon layer 6004 for collecting carrier charges generated by each PIN junction of the photodiode structure 602. Then electric current extracting device 604 includes a passivation layer 6042 followed by a flattening layer 6043 overlying both the source/drain metal layer 6035 and the first transparent electrode layer 6041. Multiple through-holes K are formed at selected locations above the photodiode structure 602 to penetrate the passivation layer 6042 and the flattening layer 6043. On top of the flattening layer 6043, the electric current extracting device 604 includes a second transparent electrode layer 6044 which also fills the multiple through holes K to form an electrical connection with the first transparent electrode layer 6041. The second transparent electrode layer 6044 is to extract the carrier charges collected by the first transparent electrode layer 6041. Optionally, the first transparent electrode layer 6041 and the second transparent electrode layer 6044 can be made by any one material selected from indium tin oxide (ITO) or indium zinc oxide (IZO) or grapheme or other transparent conductive materials.

In an embodiment, each through-hole K is placed at a location for facilitating easy connection between the first transparent electrode layer 6041 and the second transparent electrode layer 6044. Referring to FIG. 6, each of the radial PIN junctions (105) of the photodiode structure 602 is an annular hole structure formed based on a recessed structure into the N-type silicon layer. The first transparent electrode layer 6041 is easier to be reached from top by the second transparent electrode layer 6044 at locations right between two adjacent radial PIN junctions (105). Therefore, as shown in FIG. 6, the through-hole K is selected to form at the location between two adjacent radial PIN junctions with recessed structures. Optionally, the first transparent electrode layer 6041 is omitted and the through-hole K is used to directly couple the second transparent electrode layer 6044 to contact the P-type silicon layer of each PIN junction for extracting the carrier charges.

Figure 7:
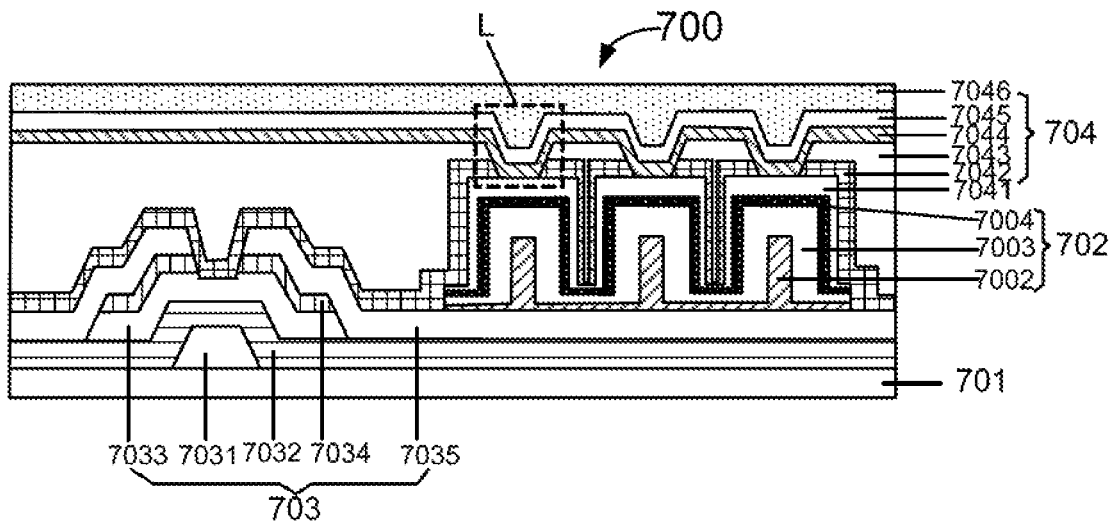
FIG. 7 is a cross-section view of an X-ray detector substrate based on the photodiode structure of FIG. 3 according to another embodiment of the present disclosure.

In an alternative embodiment, an X-ray detector substrate is provided to include a photodiode structure with protruded radial PIN junctions shown in FIG. 3. FIG. 7 shows a cross-section view of an X-ray detector substrate 700 based on the photodiode structure 300 of FIG. 3. As shown, in the X-ray detector substrate 700, each of multiple photodiodes 702 includes a protruded structure 7002 on an N-type silicon layer. Around the protruded structure 7002, an intrinsic silicon layer 7003 then a P-type silicon layer 7004 is sequentially overlaid to form a protruded radial PIN junction, as a light trapping element. Similar to the X-ray detector substrate 600, multiple thin-film transistors 703 is formed between the substrate 701 and the photodiodes 702 and multiple electric current extracting devices 704 are formed on top of them in the X-ray detector substrate 700. The first transparent electrode layer 7041 of the electric current extracting device 704 is formed overlying the P-type silicon layer 7004 to collect carrier charges converted from photons trapped in the radial PIN junction. Multiple through-holes L are formed on top of each radial PIN junctions (for example, the radial junction 105 shown in FIG. 1 and FIG. 2) to penetrate both a passivation layer 7042 and a flattening layer 7043 to connect with a second transparent electrode layer 7044 for facilitating carrier charge extraction. Other details about the structures of the X-ray detector substrate 700 are substantially the same as those in the X-ray detector substrate 600.

Figure 8:
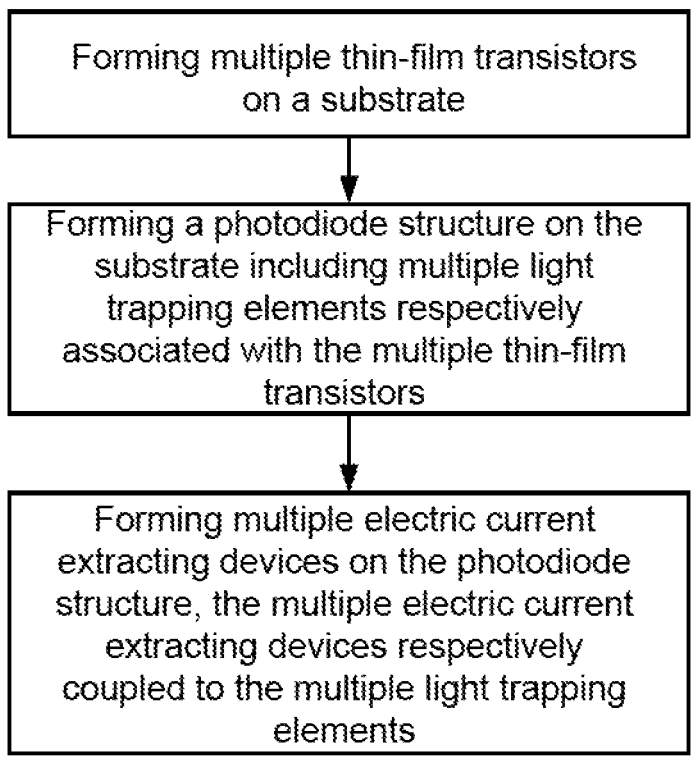
FIG. 8 is flow chart showing a method of fabricating the X-ray detector substrate according to an embodiment of the present disclosure.

In another aspect, the present disclosure also provides a method of fabricating the X-ray detector substrate described herein. FIG. 8 shows a flow chart illustrating the method with several processes. Referring to FIG. 8, the method includes a process of forming multiple thin-film transistors on a substrate. The multiple thin-film transistors are used for collecting electric signals for generating digital images produced by X-ray illumination. The thin-film transistors can be formed as top-gate thin-film transistors. Optionally, the thin-film transistors can be formed as bottom-gate thin-film transistors. The method further includes a process of forming a photodiode structure on the substrate including multiple light trapping elements respectively associated with the multiple thin-film transistors. The photodiode structure may be provided as one shown in FIG. 1 or as one shown in FIG. 3, including multiple light trapping elements configured as radial PIN junctions described herein. Forming the photodiode structure on the multiple thin-film transistors includes forming an electric contact between an N-type silicon layer of one of radial PIN junctions and a drain (or source) metal layer of one of the multiple thin-film transistors one-to-one correspondingly. Additionally, the method includes a process of forming multiple electric current extracting devices on the photodiode structure. The multiple electric current extracting devices are respectively coupled to the multiple light trapping elements. Particularly, the coupling is also on a one-to-one basis. Each electric current extracting device includes an electrode layer configured to couple with a P-type silicon layer of a radial PIN junction for extracting carrier charges generated thereof.

Particularly, the process of forming multiple electric current extracting devices on the photodiode structure includes, firstly, forming a first transparent electrode layer on the P-type silicon layer. Secondly, the process includes forming a passivation layer and a flattening layer overlying the first transparent electrode layer and also a source/drain metal layer of the thin-film transistors. Thirdly, the process includes forming multiple through-holes penetrating the passivation layer and the flattening layer. Lastly, the process includes sequentially forming a second transparent electrode layer, a conductive metal layer, and a protection layer over the flattening layer. The second transparent electrode layer fills all the through-holes to form electrical contacts with the first transparent electrode layer.

In the structures described above for each X-ray detector substrate, the photodiode structure includes multiple radial PIN junctions as light trapping elements which are configured to be substantially in parallel to each other and perpendicular to the substrate and the transparent electrode layer that used to extract carrier current. As a result, these light trapping elements with radial PIN junctions facilitate trapping visible light thereof that is converted from X-ray and induce multiple reflections via P-type silicon layers to enhance photoelectric conversion efficiency of the photodiodes. The nominal axis direction of the radial PIN junctions in perpendicular to the carrier current flowing along the transparent electrode layer also help to reduce interference of the carrier current to the electric signals deduced by the thin-film transistors for generating image with higher signal-to-noise ratio. Making the radial PIN junctions substantially vertically standing on the substrate allows opportunity to minimize the size of each light trapping element of the photodiode structure for enhancing resolution of the X-ray image.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A photodiode structure comprising multiple light trapping elements, each light trapping element comprising an N-type silicon layer with a recessed structure therein, an intrinsic silicon layer overlying the N-type silicon layer including a side region and a bottom region inside the recessed structure, and a P-type silicon layer as an inner layer overlying the intrinsic silicon layer inside the recessed structure, forming a radial PIN junction around a nominal axis of the recessed structure.

2. The photodiode structure of claim 1, wherein the multiple light trapping elements are arranged periodically.

3. The photodiode structure of claim 2, wherein the N-type silicon layer of each of the multiple light trapping elements is one physical layer with multiple recessed structures patterned therein substantially perpendicular to a base substrate.

4. The photodiode structure of claim 1, wherein each recessed structure is a cylindrical shape with a hollow cylinder structure around the nominal axis surrounded by the P-type silicon layer.

5. The photodiode structure of claim 4, wherein the N-type silicon layer comprises a thickness in a proximate range from 800 nm to 1200 nm and a depth of each recessed structure in a proximate range from 700 nm to 1100 nm, each recessed structure has a diameter of proximately 1200 nm to 1800 nm, and two adjacent recessed structures has a distance of proximately 1300 nm to 2000 nm.

6. The photodiode structure of claim 1, wherein the intrinsic silicon layer comprises a thickness of proximately 200 nm to 300 nm.

7. The photodiode structure of claim 1, wherein the P-type silicon layer comprises a thickness of proximately 15 nm to 40 nm.

8. An X-ray detector panel comprising a substrate, a photodiode structure of claim 1 disposed on the substrate, multiple thin-film transistors disposed between the photodiode structure and the substrate, and multiple electric current extracting devices disposed on the photodiode structure; wherein each of the multiple thin-film transistor includes a drain terminal coupled to the N-type silicon layer of a corresponding one of the multiple light trapping elements and each of the multiple electric current extracting device is coupled to the P-type silicon layer of the corresponding one of the multiple light trapping elements.

9. The X-ray detector panel of claim 8, wherein each of the multiple electric current extracting devices includes a first transparent electrode layer disposed on the photodiode structure, a passivation layer overlying the first transparent electrode layer, a second transparent electrode layer overlying the passivation layer and connecting to the first transparent electrode layer by filling a through-hole penetrating the passivation layer, a conductor metal layer overlying the second transparent electrode layer, and a protection layer overlying the conductor metal layer.

10. The X-ray detector panel of claim 9, wherein the through-hole penetrating the passivation layer is formed at a region between two adjacent radial PIN junctions.

11. A photodiode structure comprising multiple light trapping elements, each light trapping element comprising an N-type silicon layer with protruded structure thereon, an intrinsic silicon layer disposed overlying the N-type silicon layer including a side region and a top region of the protruded structure, and a P-type silicon layer disposed as an outer layer overlying the intrinsic silicon layer around the protruded structure, forming a radial PIN junction around a nominal axis of the protruded structure substantially perpendicular to a base substrate.

12. The photodiode structure of claim 11, wherein each protruded structure is a cylindrical shape around the nominal axis surrounded firstly by the intrinsic silicon layer and secondly by the P-type silicon layer.

13. The photodiode structure of claim 12, wherein the N-type silicon layer of each of the multiple light trapping elements is one physical layer having a thickness of proximately 15 nm to 40 nm and multiple protruded structure formed thereon, the protruded structure has a height in a proximate range from 800 nm to 1100 nm and a diameter in a proximate range of from 25 nm to 50 nm, two adjacent protruded structure has a distance of proximately 1300 nm to 2000 nm, the intrinsic silicon layer comprises a thickness of proximately 200 nm to 300 nm, and the P-type silicon layer comprises a thickness of proximately 15 nm to 40 nm.

14. An X-ray detector substrate comprising a substrate, a photodiode structure of claim 11 disposed on the substrate, multiple thin-film transistors disposed between the photodiode structure and the substrate, and multiple electric current extracting devices disposed on the photodiode structure; wherein each of the multiple thin-film transistor includes a drain or source terminal coupled to the N-type silicon layer of a corresponding one of the multiple light trapping elements and each of the multiple electric current extracting device is coupled to the P-type silicon layer of the corresponding one of the multiple light trapping elements.

15. The X-ray detector substrate of claim 14, wherein each of the multiple electric current extracting devices includes a first transparent electrode layer disposed on the photodiode structure, a passivation layer overlying the first transparent electrode layer, a second transparent electrode layer overlying the passivation layer and connecting to the first transparent electrode layer by filling a through-hole penetrating the passivation layer, a conductor metal layer overlying the second transparent electrode layer, and a protection layer overlying the conductor metal layer.

16. The X-ray detector substrate of claim 15, wherein the through-hole penetrating the passivation layer is formed on top of each radial PIN junction.

17. A method of fabricating a photodiode structure of claim 11, comprising:
    forming an N-type silicon layer on a substrate;
    forming multiple protruded structures in N-type silicon material on the N-type silicon layer;
    forming an intrinsic silicon layer overlying the N-type silicon material including a side region and a top region of each of the multiple protruded structures;
    forming a P-type silicon layer as an outer layer overlying the intrinsic silicon layer; wherein a radial PIN junction is formed around a nominal axis of each of the multiple protruded structures.

18. A method of fabricating an X-ray detector substrate comprising a substrate, a photodiode structure disposed on the substrate, multiple thin-film transistors disposed between the photodiode structure and the substrate, and multiple electric current extracting devices disposed on the photodiode structure; wherein each of the multiple thin-film transistor includes a drain or source terminal coupled to the N-type silicon layer of a corresponding one of multiple light trapping elements and each of the multiple electric current extracting device is coupled to the P-type silicon layer of the corresponding one of the multiple light trapping elements,
    wherein the photodiode structure comprising multiple light trapping elements, each light trapping element comprising an N-type silicon layer with protruded structure thereon, an intrinsic silicon layer disposed overlying the N-type silicon layer including a side region and a top region of the protruded structure, and a P-type silicon layer disposed as an outer layer overlying the intrinsic silicon layer around the protruded structure, forming a radial PIN junction around a nominal axis of the protruded structure substantially perpendicular to a base substrate;
    wherein each of the multiple electric current extracting devices includes a first transparent electrode layer disposed on the photodiode structure, a passivation layer overlying the first transparent electrode layer, a second transparent electrode layer overlying the passivation layer and connecting to the first transparent electrode layer by filling a through-hole penetrating the passivation layer, a conductor metal layer overlying the second transparent electrode layer, and a protection layer overlying the conductor metal layer;
    the method comprising:
    forming multiple thin-film transistors on a substrate;
    forming a photodiode structure on the substrate including multiple light trapping elements, each light trapping element comprising an N-type silicon layer with protruded structure thereon, an intrinsic silicon layer disposed overlying the N-type silicon layer including a side region and a top region of the protruded structure, and a P-type silicon layer disposed as an outer layer overlying the intrinsic silicon layer around the protruded structure, forming a radial PIN junction around a nominal axis of the protruded structure substantially perpendicular to a base substrate using the method of claim 17, each of the multiple light trapping elements including a protruded radial PIN junction having an N-type silicon layer coupled to a drain terminal layer of a respective one of the multiple thin-film transistors;
    forming multiple electric current extracting devices on the photodiode structure, the multiple electric current extracting devices being respectively coupled to the multiple light trapping elements of the photodiode structure.

19. A method of fabricating a photodiode structure comprising multiple light trapping elements, each light trapping element comprising an N-type silicon layer with a recessed structure therein, an intrinsic silicon layer overlying the N-type silicon layer including a side region and a bottom region inside the recessed structure, and a P-type silicon layer as an inner layer overlying the intrinsic silicon layer inside the recessed structure, forming a radial PIN junction around a nominal axis of the recessed structure, the method comprising:
    forming an N-type silicon layer on a substrate;
    forming multiple recessed structures in the N-type silicon layer;
    forming an intrinsic silicon layer overlying the N-type silicon layer including a side region and a bottom region inside each of the multiple recessed structures;
    forming a P-type silicon layer as an inner layer overlying the intrinsic silicon layer inside each of the multiple recessed structures; wherein a radial PIN junction is formed around a nominal axis of each of the multiple recessed structures.

20. A method of fabricating an X-ray detector substrate comprising a substrate, a photodiode structure disposed on the substrate, multiple thin-film transistors disposed between the photodiode structure and the substrate, and multiple electric current extracting devices disposed on the photodiode structure; wherein each of the multiple thin-film transistor includes a drain terminal coupled to an N-type silicon layer of a corresponding one of multiple light trapping elements and each of the multiple electric current extracting device is coupled to a P-type silicon layer of the corresponding one of the multiple light trapping elements, the method comprising:
    forming multiple thin-film transistors on a substrate;
    forming a photodiode structure on the substrate including multiple light trapping elements using the method of claim 17, each of the multiple light trapping elements including a recessed radial PIN junction having an N-type silicon layer coupled to a drain terminal layer of a respective one of the multiple thin-film transistors; and
    forming multiple electric current extracting devices on the photodiode structure, the multiple electric current extracting devices being respectively coupled to the multiple light trapping elements of the photodiode structure.

* * * * *